United States Patent
Liu et al.

(10) Patent No.: US 6,965,424 B2
(45) Date of Patent: Nov. 15, 2005

(54) METHOD OF PREVENTING SEAL DAMAGE IN LCD PANEL MANUFACTURING

(75) Inventors: Hsiang Lung Liu, Taoyuan Hsien (TW); Hsu-Ho Wu, Hsinchu (TW)

(73) Assignee: Hannstar Display Corp., Taipei (TW)

( * ) Notice: Subject to any disclaimer, the term of this patent is extended or adjusted under 35 U.S.C. 154(b) by 143 days.

(21) Appl. No.: 10/331,824

(22) Filed: Dec. 30, 2002

(65) Prior Publication Data

US 2003/0219922 A1 Nov. 27, 2003

(30) Foreign Application Priority Data

May 23, 2002 (TW) ........................................ 91110908 A

(51) Int. Cl.⁷ ................................................ G02F 1/13
(52) U.S. Cl. ...................... 349/187; 349/155; 349/153; 349/189; 349/190
(58) Field of Search .................... 349/153, 155–157, 349/187, 189, 190, 192

(56) References Cited

U.S. PATENT DOCUMENTS

| 5,263,888 A | * | 11/1993 | Ishihara et al. ............... 445/25 |
| 5,905,559 A | * | 5/1999 | Fujiwara et al. ............ 349/190 |
| 6,078,379 A | * | 6/2000 | Nagae et al. ................ 349/155 |
| 2004/0263711 A1 | * | 12/2004 | Matsumoto et al. .......... 349/44 |

FOREIGN PATENT DOCUMENTS

JP         11-264991         9/1999         ......... G02F/1/1339

* cited by examiner

*Primary Examiner*—Robert H. Kim
*Assistant Examiner*—Michael H Caley
(74) *Attorney, Agent, or Firm*—Thomas, Kayden, Horstemeyer & Risley

(57) ABSTRACT

A method of preventing seal damage in LCD panel manufacturing. A photo spacer pattern made of photoresist is used instead of extra seal pattern, such that tact time of sealing process is reduced, air blockage is enhanced, the number of TFT-array areas able to be formed on a glass substrate is increased, and chipping or unevenness of the panel resulting during panel cutting owing to extra seal patterns are all avoided.

15 Claims, 5 Drawing Sheets

METHOD OF PREVENTING SEAL DAMAGE IN LCD PANEL MANUFACTURING

BACKGROUND OF THE INVENTION

1. Field of the Invention

The present invention relates to the field of LCD panel manufacturing. More particularly, the invention relates to a method for preventing seal damage in ODF LCD panel manufacturing.

2. Description of the Related Art

One Drop Fill (ODF) process has become a new form of LCD panel manufacturing. FIG. 1 shows an equipment currently used for ODF LCD panel manufacture. The equipment may be a press machine having an upper chuck 14 and a lower chuck 15 in a vacuum chamber 13, wherein at least one of the chucks is movable. The equipment may also be provided with an image recognition camera (not illustrated). The operation of the equipment as illustrated in FIG. 1 is described hereinafter. First, one substrate 12 is held by the lower chuck 15, and the other substrate 11 is held by the vacuum formed of the upper chuck 14. Then, after decreasing the air pressure inside the vacuum chamber 13 to a predetermined vacuum level; alignment of the upper side substrate 11 and the lower side substrate 12 is performed to a predetermined accuracy referring to the alignment marks (not shown) by a rotational member 16, and pressure is applied to the chucks 14 and 15 until the gap between the two substrates reaches a predetermined thickness, and the chamber 13 is brought to atmospheric air pressure through an air-removal hole 17.

However, to prevent disadvantages that might occur owing to the sudden change in pressure such as damage to the seals, unevenness of gap thickness, and even contamination of liquid crystal and LCD active areas, an extra seal pattern 22 is usually applied along the periphery of the substrate 21 as shown in FIG. 2, one or two seal patterns 24 are usually applied on the outer side of the original seal pattern 23, and a cross seal pattern 25 is applied between each TFT-array area to block air entry that might destroy the TFT-array areas when the seal pattern 23 is damaged.

The above methods to prevent damage to the seal patterns still have shortcomings, for example, a longer time is required to apply the extra seal patterns, thus increasing the tact time of LCD panel manufacture; the seal patterns are not cured from the change in pressure such that the air blockage is not high sufficient and bubbles may occur. Furthermore, application of a seal pattern must usually maintain a minimum distance of about 10 mm from other seal patterns to maintain best performance, therefore, too many seal patterns on the substrate can limit the number of TFT-array areas that can be formed thereon and may also cause chipping, breaking the substrate.

SUMMARY OF THE INVENTION

Therefore, the purpose of the invention is to provide a method of preventing seal damage in LCD panel manufacturing, in which photo spacer of photoresist is used instead of extra seal patterns.

Thus, the invention provides a method of preventing seal damage in LCD panel manufacturing, comprising providing a pair of substrates, forming a plurality of TFT-array areas on a surface of one of the substrates and forming at least one seal pattern along the periphery of each TFT-array area, forming at least one photo spacer pattern of photoresist along the periphery of the substrates, and aligning the substrates.

The invention further provides a method of preventing seal damage in LCD panel manufacturing, further comprising a step of forming at least one seal pattern along the periphery of the substrate to increase the adhesion between the substrates.

Using photo spacer instead of extra seal patterns can decrease tact time and provide sufficient air blockage without performing further curing steps. Furthermore, application of photo spacer can relieve the limitation imposed by extra seal patterns on the number of TFT-array areas that can be formed on the substrate, and also avoid chipping by strengthening the substrate.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

The method of preventing seal damage in LCD panel manufacturing is explained by the first to seventh embodiments described below, wherein the conventional manufacturing method of photo spacers is applied in which photo resists were exposed, developed, and then etched to form photo spacers. The photo resists applied can be either negative or positive type, and of any photo-resistive materials.

Figure 2:
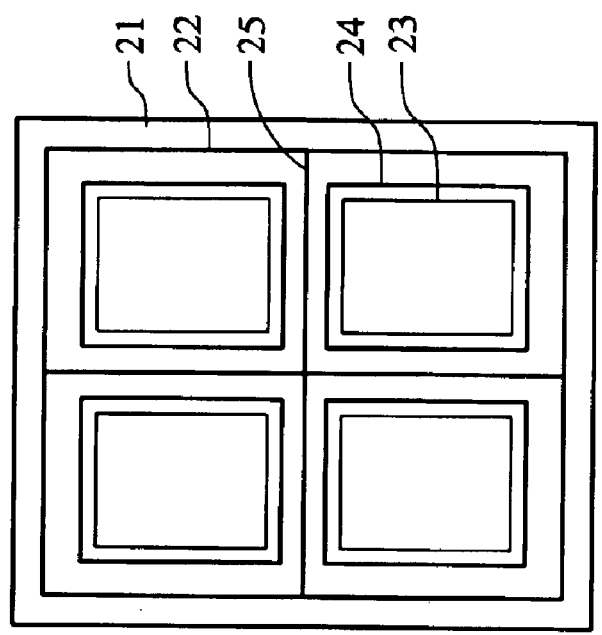
FIG. 2 shows the seal pattern applied in conventional ODF LCD panel manufacturing.
Figure 1:
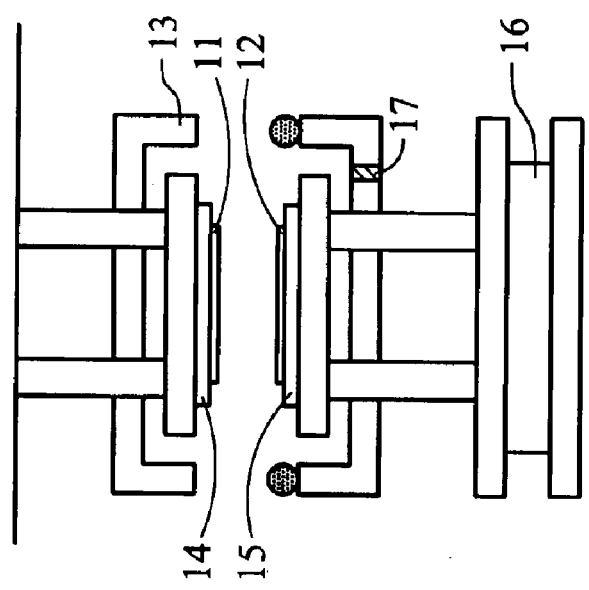
FIG. 1 shows an equipment used for conventional ODF LCD panel manufacture.
Figure 3B:
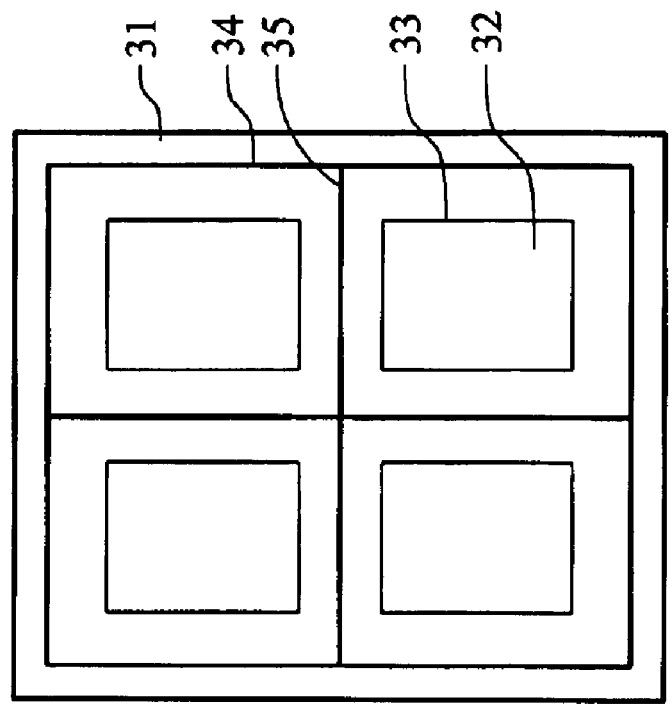
FIG. 3b shows the photo spacer pattern and seal pattern applied in the second embodiment of the present invention.
Figure 3A:
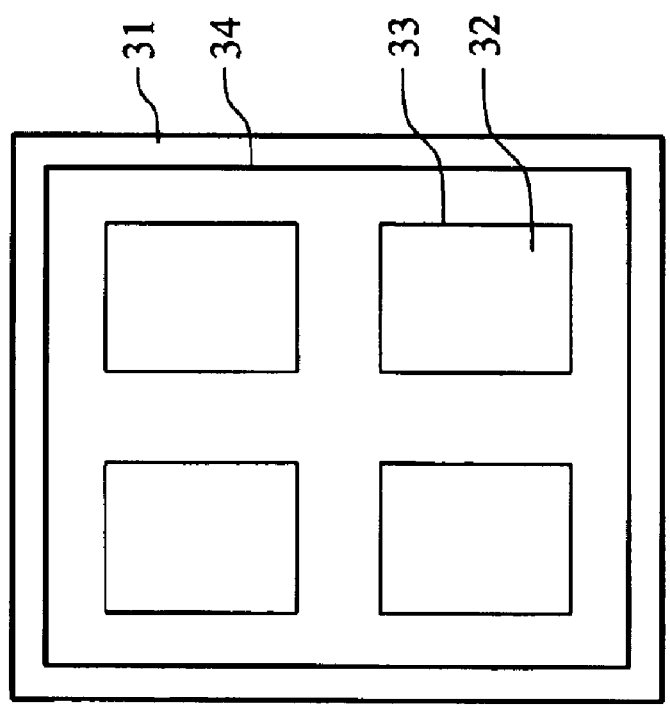
FIG. 3a shows the photo spacer pattern and seal pattern applied in the first embodiment of the present invention.

First Embodiment:

In FIG. 3a, before alignment of a pair of substrates in a vacuum chamber 13 as shown in FIG. 1, a seal pattern 33 is formed on the substrate 31 along the periphery of the TFT-array area 32, and a photo spacer pattern 34 of photoresist is formed along the periphery of the substrate 31. Alignment of the substrate 31 and the other substrate (not shown) is then performed to a predetermined accuracy referring to the alignment marks (not shown). Pressure is applied to the chucks 14 and 15 until the gap between the substrates reaches a predetermined thickness, and the chamber 13 is brought to atmospheric air pressure.

Second Embodiment:

In FIG. 3b, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a cross photo spacer pattern 35 is formed between each TFT-array area 32 to avoid large-scale damage to all TFT-array areas when one TFT-array area is damaged. Substrate 31 and the other substrate (not shown) are aligned to a predetermined accuracy referring to the alignment marks (not shown). Pressure is then applied to the chucks 14 and 15 until the gap between the substrates reaches a predetermined thickness, and the chamber 13 is brought to atmospheric air pressure.

Figure 3D:
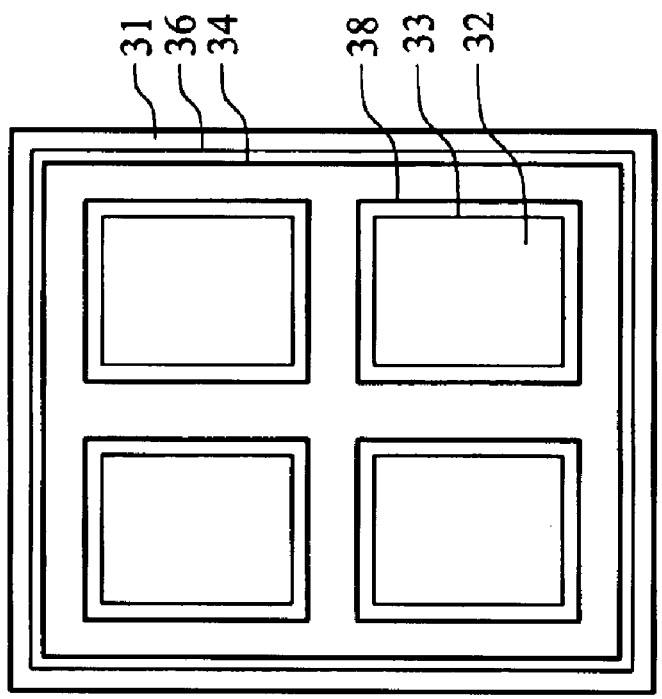
FIG. 3d shows the photo spacer pattern and seal pattern applied in the fourth embodiment of the present invention.
Figure 3C:
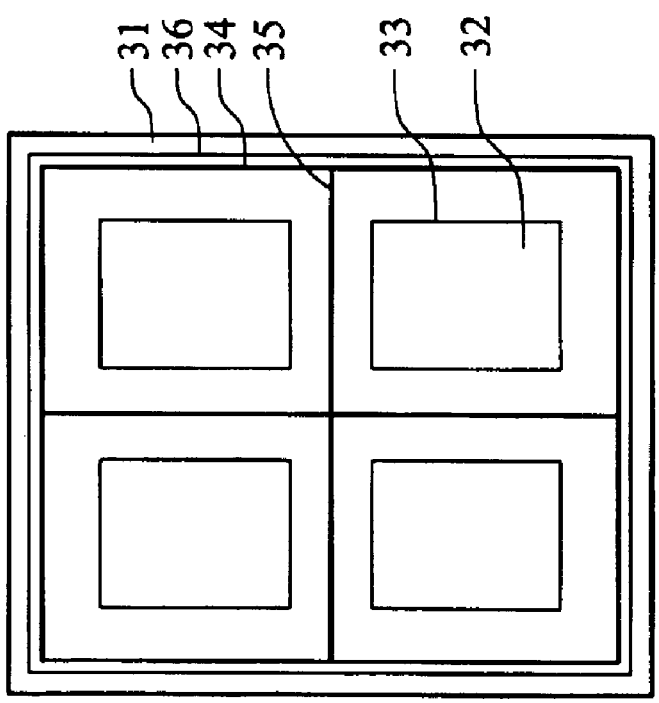
FIG. 3c shows the photo spacer pattern and seal pattern applied in the third embodiment of the present invention.

Third Embodiment:

In FIG. 3c, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a cross photo spacer pattern 35 is formed between each TFT-array area 32 to avoid large-scale damage to all TFT-array areas when one TFT-array area is damaged. Next, a seal pattern 36 is formed along the outer periphery of photo spacer pattern 34 to increase the adhesion between the substrates. The substrate 31 and the other substrate (not shown) are then aligned to a predetermined accuracy referring to the alignment marks (not shown), and pressure is applied to the chucks 14 and 15 until the gap between the substrates reaches a predetermined thickness, and the chamber 13 is brought to atmospheric air pressure.

Fourth Embodiment:

In FIG. 3d, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a seal pattern 36 is formed along the outer periphery of photo spacer pattern 34 to increase the adhesion between the substrates. Next, a photo spacer pattern 38 is formed along the outer periphery of seal pattern 33 to prevent damage to the seal from the change in pressure. The substrate 31 and the other substrate (not shown) are then aligned to a predetermined accuracy referring to the alignment marks (not shown), and pressure is applied to the chucks 14 and 15 until the gap between the substrates reaches a predetermined thickness, and the chamber 13 is brought to atmospheric air pressure.

Figure 3F:
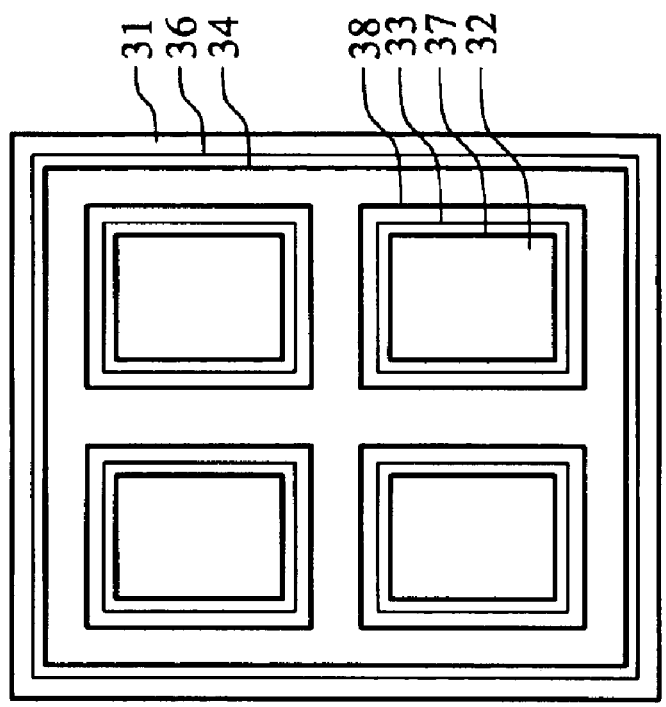
FIG. 3f shows the photo spacer pattern and seal pattern applied in the sixth embodiment of the present invention.
Figure 3E:
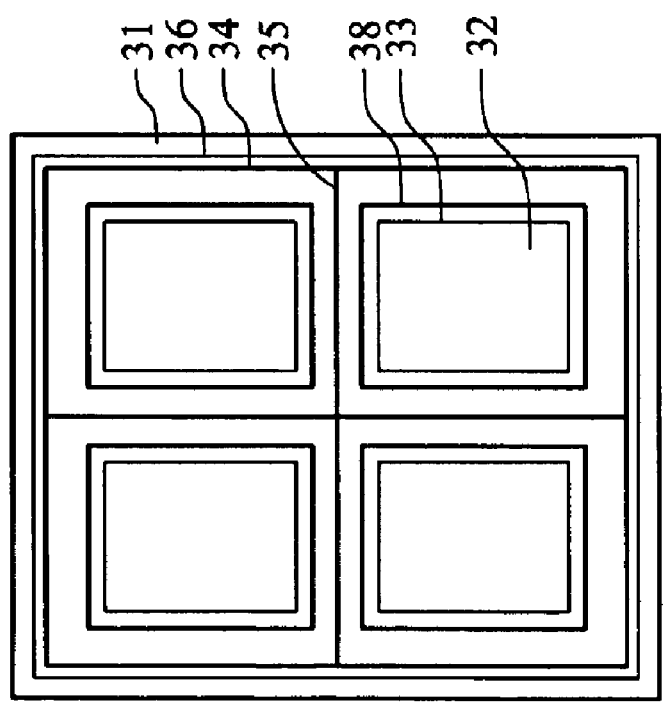
FIG. 3e shows the photo spacer pattern and seal pattern applied in the fifth embodiment of the present invention.

Fifth Embodiment:

In FIG. 3e, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a cross photo spacer pattern 35 is formed between each TFT-array area 32 to avoid large-scale damage to all TFT-array areas when one TFT-array area is damaged. Next, a seal pattern 36 is formed along the outer periphery of photo spacer pattern 34 to increase the adhesion between the substrates. Next, a photo spacer pattern 38 is formed along the outer periphery of seal pattern 33 to prevent damage to the seal from the change in pressure. The substrate 31 and the other substrate (not shown) are then aligned to a predetermined accuracy referring to the alignment marks (not shown), and pressure is applied to the chucks 14 and 15 until the gap between the substrates reaches a predetermined thickness, and the chamber 13 is brought to atmospheric air pressure.

Sixth Embodiment:

In FIG. 3f, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a seal pattern 36 is formed along the outer periphery of photo spacer pattern 34 to increase the adhesion between the substrates. Next, a photo spacer pattern 37 is formed along the inner periphery of seal pattern 33 to avoid contamination of TFT-array areas. Next, a photo spacer pattern 38 is formed along the outer periphery of seal pattern 33 to prevent damage to the seal from the change in pressure. The substrate 31 and the other substrate (not shown) are then aligned to a predetermined accuracy referring to the alignment marks (not shown), and pressure is applied to the chucks 14 and 15 until the gap between the substrates reaches a predetermined thickness, and the chamber 13 is brought to atmospheric air pressure.

Figure 3G:
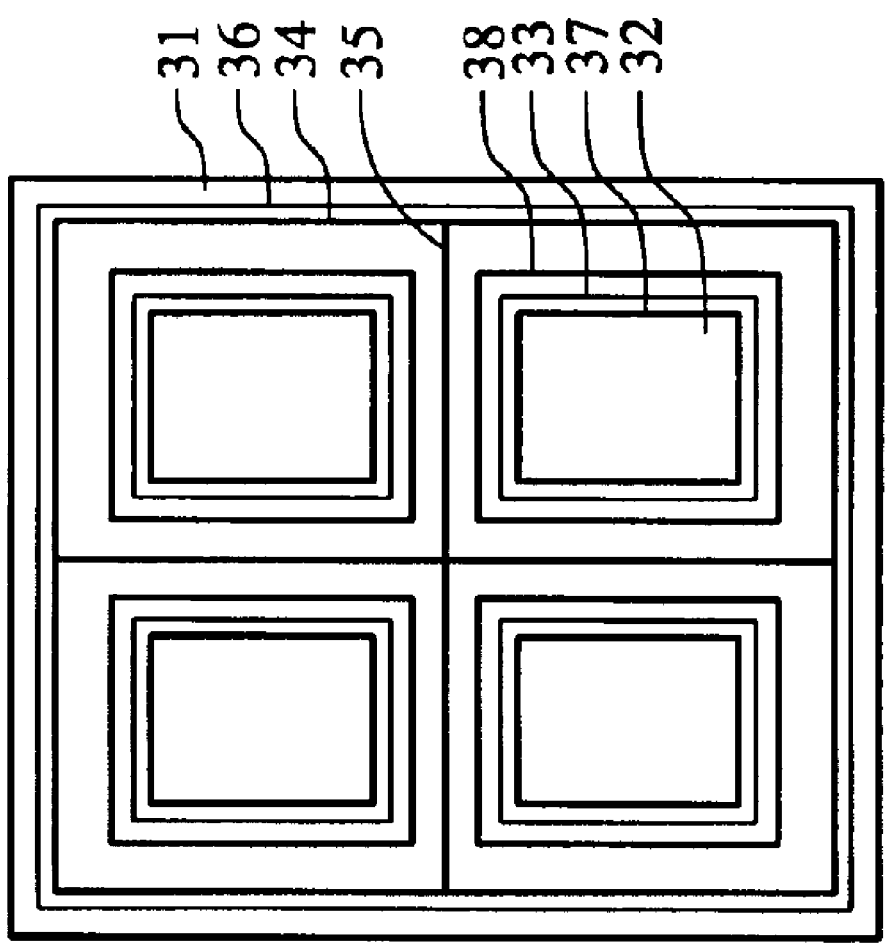
FIG. 3g shows the photo spacer pattern and seal pattern applied in the seventh embodiment of the present invention.

Seventh Embodiment:

In FIG. 3g, before the alignment of a pair of substrates in a vacuum chamber 13 as shown in FIG. 1, a seal pattern 33 is formed on the substrate 31 along the periphery of the TFT-array area 32, a photo spacer pattern 34 of photoresist is formed along the periphery of the substrate 31, and a cross photo spacer pattern 35 is formed between each TFT-array area 32 to avoid large-scale damage to all TFT-array areas when one TFT-array area is damaged. Next, a seal pattern 36 is formed along the outer periphery of photo spacer pattern 34 to increase the adhesion between the substrates. Next, a photo spacer pattern 37 is formed along the inner periphery of seal pattern 33 to avoid contamination of TFT-array areas. Next, a photo spacer pattern 38 is formed along the outer periphery of seal pattern 33 to prevent damage to the seal from the change in pressure. The substrate 31 and the other substrate (not shown) are then aligned to a predetermined accuracy referring to the alignment marks (not shown), and pressure is applied to the chucks 14 and 15 until the gap between the substrates reaches a predetermined thickness, and the chamber 13 is brought to atmospheric air pressure.

When the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of preventing seal damage in one drop fill LCD panel manufacturing, comprising:
   (a) providing a pair of individual substrates;
   (b) forming a plurality of TFT-array areas on a surface of one of the individual substrates and forming at least one closed seal pattern about the periphery of each of the TFT-array areas;
   (c) forming at least one closed photo spacer pattern of photoresist about the periphery of one of the substrates; and
   (d) aligning the substrates in an overlying relationship with respect to each other.

2. The method as claimed in claim 1, further comprising a step of forming at least one photo spacer pattern of photoresist on the inner side of at least one of the seal patterns.

3. The method as claimed in claim 1, further comprising a step of forming at least one photo spacer pattern of photoresist on the outer side of at least one of the seal patterns.

4. The method as claimed in claim 1, further comprising a step of forming at least one photo spacer pattern of photoresist on the inner and outer sides of at least one of the seal patterns.

5. The method as claimed in claim 1, further comprising a step of forming a photo spacer pattern of photoresist among the TFT-array areas on the substrate to separate the TFT-array areas from each other.

6. A method of preventing seal damage in one drop fill LCD panel manufacturing, comprising:
  (a) providing a pair of individual substrates;
  (b) forming a plurality of TFT-array areas on a surface of one of the individual substrates and forming at least one closed seal pattern about the periphery of each of the TFT-array areas;
  (c) forming at least one seal pattern about the periphery of one of the individual substrates;
  (d) forming at least one closed photo spacer pattern of photoresist about the periphery of one of the substrates; and
  (e) aligning the substrates in an overlying relationship with respect to each other.

7. A method of preventing seal damage in one drop fill LCD panel manufacturing, comprising:
  (a) providing a pair of substrates;
  (b) forming a plurality of TFT-array areas on a surface of one of the substrates and forming at least one closed seal pattern along the periphery of each TFT-array area;
  (c) forming at least one seal pattern along the periphery of the substrates;
  (d) forming at least one closed photo spacer pattern of photoresist on the outer side of the seal pattern and along the periphery of the substrates; and
  (e) aligning the substrates.

8. The method as claimed in claim 7, further comprising a step of forming at least one photo spacer pattern of photoresist on the inner side of at least one of the seal pattern formed in step (b).

9. The method as claimed in claim 7, further comprising a step of forming at least one photo spacer pattern of photoresist on the outer side of at least one of the seal pattern formed in step (b).

10. The method as claimed in claim 7, further comprising a step of forming at least one photo spacer pattern of photoresist on the inner and outer sides of at least one of the seal pattern formed in step (b).

11. The method as claimed in claim 7, further comprising a step of forming a photo spacer pattern of photoresist among the TFT-array areas on the substrate to separate the TFT-array areas.

12. A method of preventing seal damage in one drop fill LCD panel manufacturing, comprising:
  (a) providing a pair of individual substrates;
  (b) forming a plurality of TFT-array areas and forming at least one closed seal pattern about the periphery of each of the TFT-array areas;
  (c) forming at least one closed photo spacer pattern of photoresist about the periphery of one of the individual substrates to block air;
  (d) providing the substrates in a vacuum chamber; and
  (e) aligning the substrates in an overlying relationship with respect to each other by leaking the vacuum chamber to atmospheric air pressure to join the substrates together.

13. The method as claimed in claim 12, further comprising a step of forming at least one photo spacer pattern of photoresist on the inner side of at least one of the seal patterns.

14. The method as claimed in claim 12, further comprising a step of forming at least one photo spacer pattern of photoresist on the outer side of at least one of the seal patterns.

15. The method as claimed in claim 12, further comprising a step of forming at least one photo spacer pattern of photoresist on the inner and outer sides of at least one of the seal patterns.

* * * * *